United States Patent
Nakamura

(10) Patent No.: US 7,803,696 B2
(45) Date of Patent: Sep. 28, 2010

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 174 days.

(21) Appl. No.: 11/705,428

(22) Filed: Feb. 13, 2007

(65) Prior Publication Data

US 2007/0190748 A1  Aug. 16, 2007

(30) Foreign Application Priority Data

Feb. 16, 2006  (JP) .............................. 2006-039636

(51) Int. Cl.
*H01L 21/00* (2006.01)
(52) U.S. Cl. ................... 438/463; 438/460; 438/462
(58) Field of Classification Search ................. 438/463, 438/462, 460, 458, 33, 68
See application file for complete search history.

(56) References Cited

U.S. PATENT DOCUMENTS

| 7,063,083 | B2 * | 6/2006 | Ohmiya et al. .......... 125/23.01 |
| 7,129,150 | B2 * | 10/2006 | Kawai .................... 438/463 |
| 2005/0006358 | A1 * | 1/2005 | Shigematsu et al. .... 219/121.69 |
| 2005/0186760 | A1 * | 8/2005 | Hashimura et al. ......... 438/460 |

FOREIGN PATENT DOCUMENTS

JP              3408805         3/2003

* cited by examiner

*Primary Examiner*—Thanh V Pham
*Assistant Examiner*—Errol Fernandes
(74) *Attorney, Agent, or Firm*—Smith, Gambrell & Russell, LLP

(57) ABSTRACT

A method of dividing a wafer which is partitioned by a plurality of first dividing lines extending in a predetermined direction and a plurality of second dividing, lines formed in a direction perpendicular to the plurality of first dividing lines, along the first dividing lines and the second dividing lines, comprising the step of forming a first continuous deteriorated layer in the inside of the wafer along the first dividing lines by applying a laser beam along the first dividing lines; the step of forming a second deteriorated layer in the inside of the wafer along the second dividing lines except for the intersections with the first dividing lines by applying a laser beam along the second dividing lines except for the intersections with the first dividing lines; the step of dividing the wafer along the first dividing lines where the first deteriorated layer has been formed by exerting external force to the wafer along the first dividing lines; and the step of dividing the wafer along the second dividing lines where the second deteriorated layer has been formed by exerting external force to the wafer along the second dividing lines.

7 Claims, 9 Drawing Sheets

(a)

(b)

(a)

(b)

WAFER DIVIDING METHOD

FIELD OF THE INVENTION

The present invention relates to a method of dividing a wafer having a plurality of dividing lines which are formed in a lattice pattern on the front surface, into individual chips along the dividing lines.

DESCRIPTION OF THE PRIOR ART

In the production process of a semiconductor device, a plurality of areas are sectioned by dividing lines called "streets" which are arranged in a lattice pattern on the front surface of a substantially disk-like semiconductor wafer, and a device such as IC or LSI is formed in each of the sectioned areas. Individual semiconductor chips are manufactured by cutting this semiconductor wafer along the dividing lines to divide it into each of areas having the device formed thereon. An optical device wafer comprising a gallium nitride-based compound semiconductor laminated on the front surface of a sapphire substrate is also cut along predetermined dividing lines to be divided into individual optical devices such as light emitting diodes or laser diodes which are widely used in electric appliances.

As a means of dividing a wafer such as the above semiconductor wafer or optical device wafer along the dividing lines, Japanese Patent No. 3408805 discloses a laser processing method for applying a pulse laser beam of a wavelength capable of passing through the wafer, with its focal point set to the inside of the area to be divided. In the dividing method making use of this laser processing technique, the wafer is divided into individual chips by applying a pulse laser beam of an infrared range capable of passing through the wafer from one side of the wafer, with its focal point set to the inside to continuously form a deteriorated layer in the inside of the wafer along the dividing lines and exerting external force along the dividing lines whose strength has been reduced by the formation of the deteriorated layers.

When the deteriorated layer is formed by applying a laser beam along the dividing lines formed in a lattice pattern on the front surface of the wafer and external force is exerted to the wafer where the deteriorated layers have been formed along the dividing lines, the dividing lines are divided in a zigzag manner. As a result, the wafer warps, cracks obliquely or burrs in the vicinity of the intersections of the dividing lines, thereby reducing its quality.

SUMMARY OF THE INVENTION

It is an object of the present invention to provide a wafer dividing method capable of dividing a wafer having dividing lines which are formed in a lattice pattern on the front surface, along the dividing lines accurately.

To attain the above object, according to the present invention, there is provided a method of dividing a wafer which is partitioned by a plurality of first dividing lines extending in a predetermined direction and a plurality of second dividing lines formed in a direction perpendicular to the plurality of first dividing lines, along the first dividing lines and the second dividing lines, comprising the steps of:

forming a first continuous deteriorated layer in the inside of the wafer along the first dividing lines by applying a laser beam of a wavelength capable of passing through the wafer along the first dividing lines;

forming a second deteriorated layer in the inside of the wafer along the second dividing lines except for the intersections with the first dividing lines by applying a laser beam of a wavelength capable of passing through the wafer along the second dividing lines except for the intersections with the first dividing lines;

dividing the wafer along the first dividing lines where the first deteriorated layer has been formed by exerting external force to the wafer along the first dividing lines after the first deteriorated layer forming step and the second deteriorated layer forming step; and dividing the wafer along the second dividing lines where the second deteriorated layer has been formed by exerting external force to the wafer along the second dividing lines after the first dividing step.

According to the present invention, there is further provided a method of dividing a wafer which is partitioned by a plurality of first dividing lines extending in a predetermined direction and a plurality of second dividing lines formed in a direction perpendicular to the plurality of first dividing lines, along the first dividing lines and the second dividing lines, comprising the steps of:

forming a first deteriorated layer in the inside of the wafer along the first dividing lines except for the intersections with the second dividing lines by applying a laser beam of a wavelength capable of passing through the wafer along the first dividing lines except for the intersections with the second dividing lines;

forming a second deteriorated layer in the inside of the wafer along the second dividing lines except for the intersections with the first dividing lines by applying a laser beam of a wavelength capable of passing through the wafer along the second dividing lines except for the intersections with the first dividing lines;

dividing the wafer along the first dividing lines where the first deteriorated layer has been formed or the second dividing lines where the second deteriorated layer has been formed by exerting external force to the wafer along the first dividing lines or the second dividing lines after the first deteriorated layer forming step and the second deteriorated layer forming step; and dividing the wafer along the second dividing lines where the second deteriorated layer has been formed or the first dividing lines where the first deteriorated layer has been formed by exerting external force to the wafer along the second dividing lines or the first dividing lines after the first dividing step.

Preferably, the above first deteriorated layer forming step, the second deteriorated layer forming step, the first dividing step and the second dividing step come after the step of affixing the wafer to a protective tape mounted on an annular frame.

In the wafer dividing method of the present invention, the second deteriorated layer is formed in the second dividing lines formed in the direction perpendicular to the first dividing lines where the first continuous deteriorated layer has been formed, except for the intersections with the first dividing lines, and the second deteriorated layers and the first deteriorated layers are not formed at the intersections between the first dividing lines and the second dividing lines. Therefore, when the wafer is divided along the first dividing lines where the first deteriorated layer has been formed in the first dividing step, this division does not reach the second dividing lines through the intersections. Consequently, the wafer is divided along the first dividing lines linearly and accurately.

In the wafer dividing method of the present invention, the first deteriorated layer and the second deteriorated layer are formed along the first dividing lines and the second dividing lines, except for the intersections between the first dividing lines and the second dividing lines and not formed at the intersections between the first dividing lines and the second dividing lines. Therefore, when the wafer is divided along the first dividing lines where the first deteriorated layer has been formed or the second dividing lines where the second deteriorated layer has been formed in the first dividing step, this division does not reach the second dividing lines or the first dividing lines through the intersections. Consequently, the wafer is divided along the first dividing lines or the second dividing lines linearly and accurately.

DETAILED DESCRIPTION OF THE PREFERRED EMBODIMENTS

Preferred embodiments of the wafer dividing method of the present invention will be described in detail hereinunder with reference to the accompanying drawings.

Figure 1:
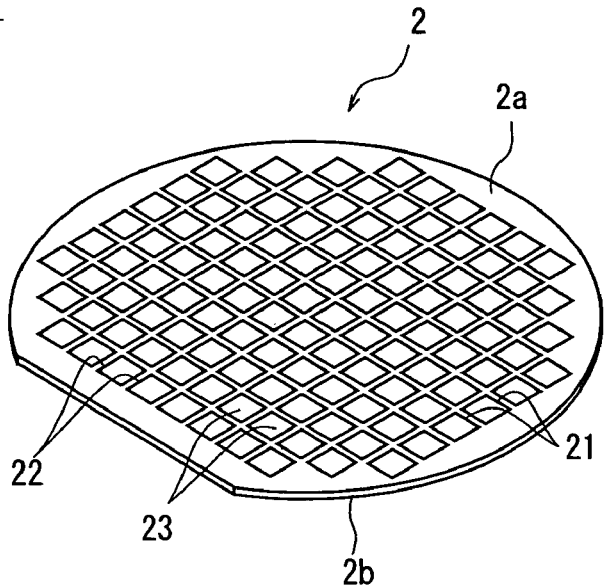
FIG. 1 is a perspective view of a semiconductor wafer to be divided into individual chips by the wafer dividing method of the present invention.

FIG. 1 is a perspective view of a semiconductor wafer as a wafer to be divided by the wafer dividing method of the present invention. The semiconductor wafer 2 shown in FIG. 1 is, for example, a silicon wafer having a thickness of 300 µm, and a plurality of first dividing lines 21 extending in a predetermined direction and a plurality of second dividing lines 22 extending in a direction perpendicular to the first dividing lines 21 are formed on the front surface 2a. A device 23 such as IC or LSI is formed in a plurality of areas sectioned by the plurality of first dividing lines 21 and the plurality of second dividing lines 22 on the front surface 2a of the semiconductor wafer 2. A first embodiment of the method of dividing this semiconductor wafer 2 into individual devices (chips) will be described hereinunder.

Figure 2:
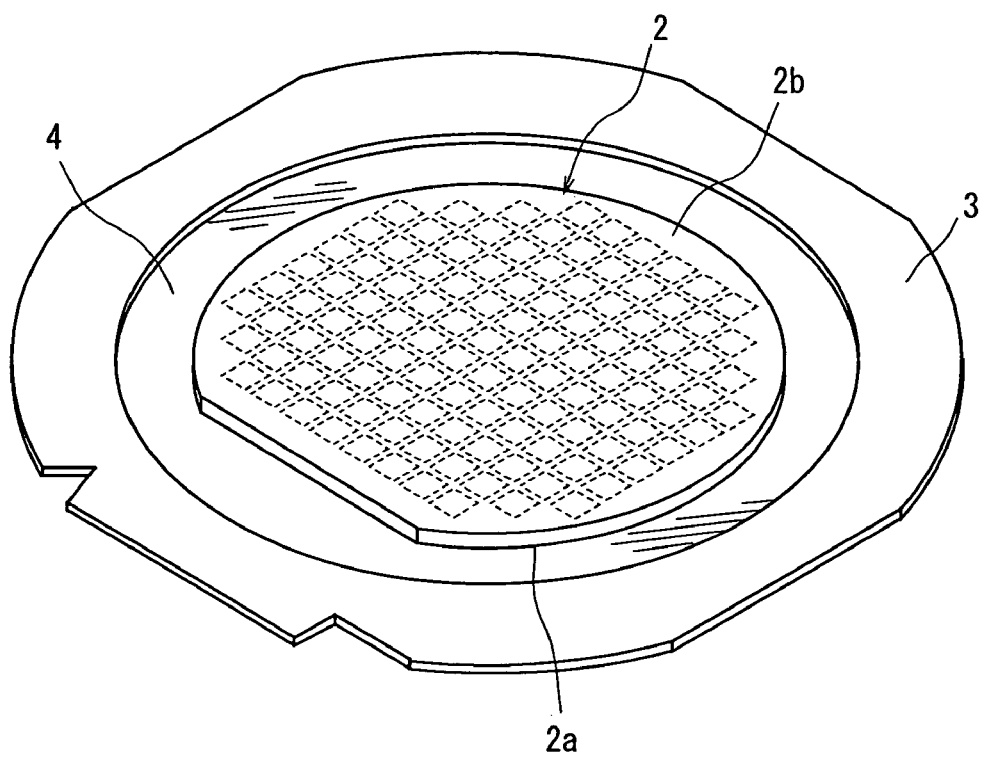
FIG. 2 is a perspective view showing a state of the semiconductor wafer shown in FIG. 1, put on the surface of a protective tape mounted on an annular frame.

The front surface 2a side of the semiconductor wafer 2 shown in FIG. 1 is affixed to a protective tape 4 composed of a synthetic resin sheet such as a polyolefin sheet mounted on an annular frame 3 as shown in FIG. 2 (protective tape affixing step). Therefore, the rear surface 2b of the semiconductor wafer 2 faces up.

After the above protective tape affixing step, next comes a first deteriorated layer forming step for forming a first continuous deteriorated layer in the inside of the semiconductor wafer 2 along the first dividing lines 21 by applying a pulse laser beam of a wavelength capable of passing through a silicon wafer along the first dividing lines 21. This first deteriorated layer forming step is carried out by using a laser beam processing machine 5 shown in FIG. 3. The laser beam processing machine 5 shown in FIG. 3 has a chuck table 51 for holding a workpiece, a laser beam application means 52 for applying a laser beam to the workpiece held on the chuck table 51, and an image pick-up means 53 for picking up an image of the workpiece held on the chuck table 51. The chuck table 51 is designed to suction-hold the workpiece and to be moved in a processing-feed direction indicated by an arrow X and an indexing-feed direction indicated by an arrow Y in FIG. 3 by a moving mechanism that is not shown. The laser beam processing machine 5 shown in FIG. 3 comprises a processing-feed amount detection means (not shown) for detecting the processing-feed amount of the chuck table 51. This processing-feed amount detection means supplies a detection signal to a control means that is not shown. The control means (not shown) comprises a memory for storing the coordinate values of intersections between the first dividing lines 21 and the second dividing lines 22 formed on the above semiconductor wafer 2 and collates the coordinate values of the intersections with the detection signal from the processing-feed amount detection means to output a control signal to the laser beam application means 52.

The above laser beam application-means 52 includes a cylindrical casing 521 arranged substantially horizontally. In the casing 521, there is installed a pulse laser beam oscillation means (not shown) which comprises a pulse laser beam oscillator composed of a YAG laser oscillator or YVO4 laser oscillator and a repetition frequency setting means. A condenser 522 for converging a pulse laser beam oscillated from the pulse laser beam oscillation means is attached to the end of the above casing 521.

The image pick-up means 53 mounted on the end portion of the casing 521 constituting the above laser beam application means 52 comprises an infrared illuminating means for applying infrared radiation to the workpiece, an optical system for capturing infrared radiation applied by the infrared illuminating means, and an image pick-up device (infrared CCD) for outputting an electric signal corresponding to the infrared radiation captured by the optical system, in addition to an ordinary image pick-up device (CCD) for picking up an image with visible radiation in the illustrated embodiment. An image signal is supplied to the control means that is not shown.

Figure 4:
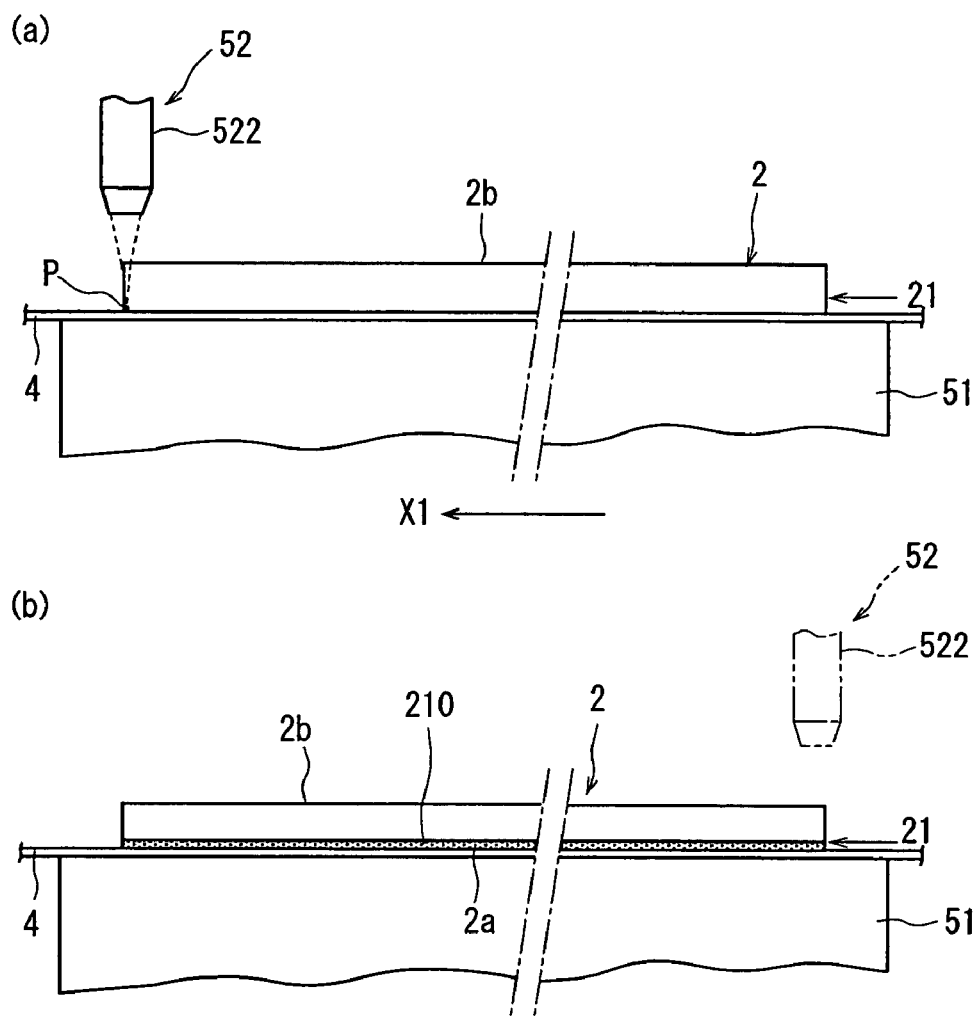
FIGS. 4(a) and 4(b) are diagrams showing a first embodiment of the first deteriorated layer forming step in the wafer dividing method of the present invention.
Figure 5:
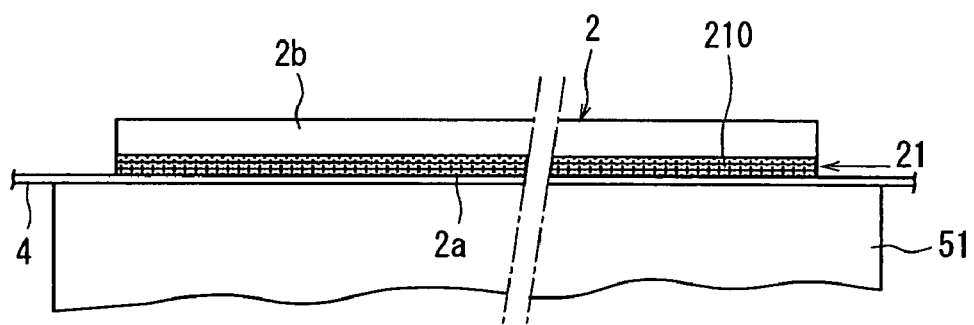
FIG. 5 is a diagram showing a state where deteriorated layers are formed in the inside of the semiconductor wafer in the first deteriorated layer forming step shown in FIGS. 4(a) and 4(b)

The step of forming a first deteriorated layer along the first dividing lines 21 of the above semiconductor wafer 2 by using the above laser beam processing machine 5 will be described with reference to FIGS. 3 to 5.

Figure 3:
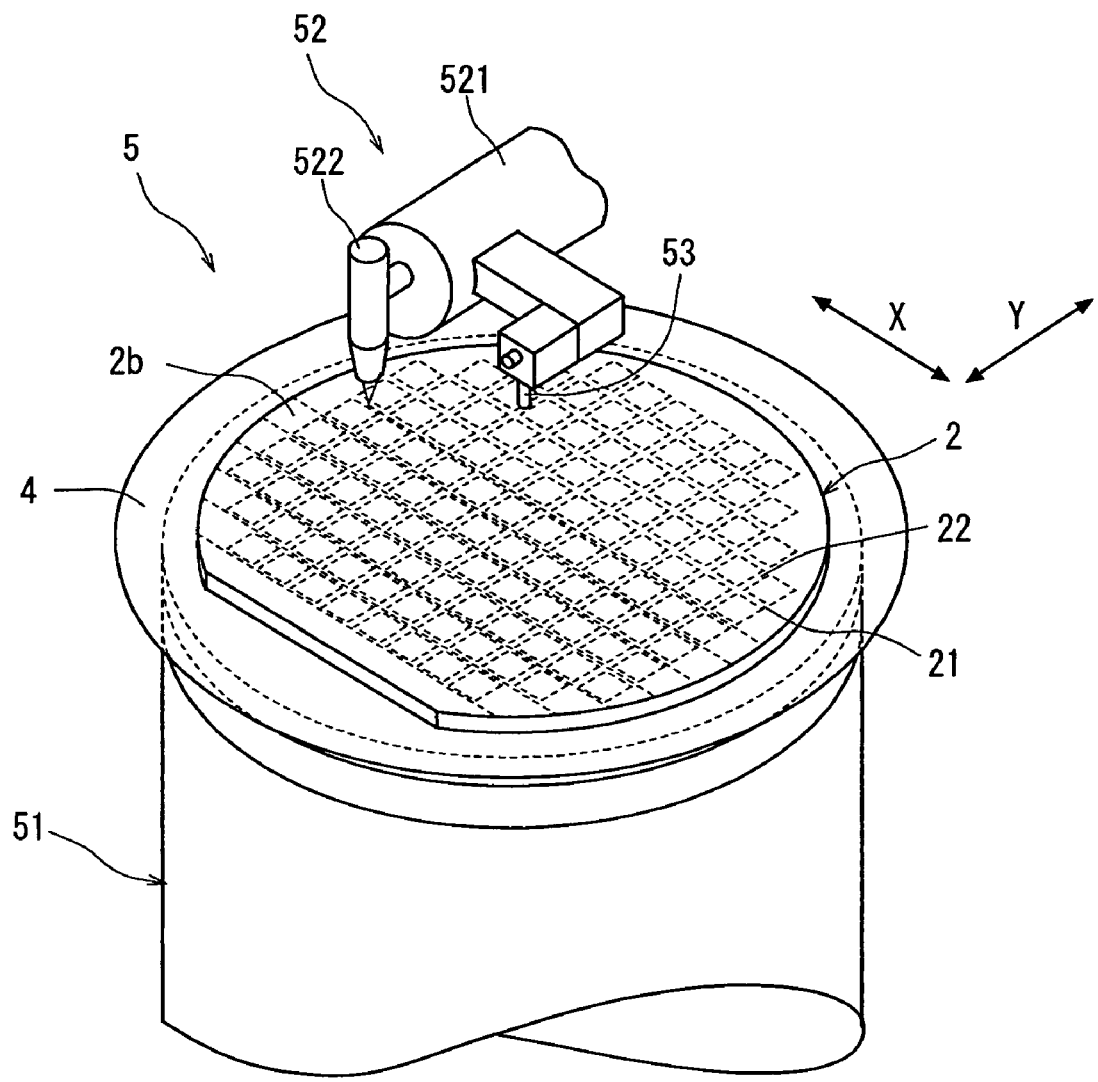
FIG. 3 is a perspective view of the principal portion of a laser beam processing machine for carrying out the first deteriorated layer forming step and the second deteriorated layer forming step in the wafer dividing method of the present invention.

The semiconductor wafer 2 is first placed on the chuck table 51 of the laser beam processing machine 5 shown in FIG. 3 in such a manner that the rear surface 2b faces up and suction-held on the chuck table 51. Although the annular frame 3 on which the protective tape 4 is mounted is not shown in FIG. 3, it is held by a suitable frame holding means provided on the chuck table 51. The chuck table 51 suction-holding the semiconductor wafer 2 is brought to a position right below the image pick-up means 53 by the moving mechanism that is not shown.

After the chuck table 51 is positioned right below the image pick-up means 53, alignment work for detecting the area to be processed of the semiconductor wafer 2 is carried out by the image pick-up means 53 and the control means that is not shown. That is, the image pick-up means 53 and the control means (not shown) carry out image processing such as pattern matching, etc. to align a first dividing line 21 formed in a predetermined direction of the semiconductor wafer 2 with the condenser 522 of the laser beam application means 52 for applying a laser beam along the first dividing line 21, thereby performing the alignment of a laser beam application position (alignment step). The alignment of the laser beam application position is also carried out on the second dividing lines 22 formed on the semiconductor wafer 2 in a direction perpendicular to the above first dividing lines 21. Although the front surface 2a having the first dividing lines 21 and the second dividing lines 22 formed thereon of the semiconductor wafer 2 faces down at this point, as the image pick-up means 53 comprises the infrared illuminating means, optical system for capturing infrared radiation and image pick-up device (infrared CCD) for outputting an electric signal corresponding to the infrared radiation as described above, an image of the first dividing line 21 can be picked up through the rear surface 2b.

After the first dividing line 21 formed on the semiconductor wafer 2 held on the chuck table 51 is detected and the alignment of the laser beam application position is carried out as described above, the chuck table 51 is moved to a laser beam application area where the condenser 522 of the laser beam application means 52 is located as shown in FIG. 4(a) so as to bring one end (left end in FIG. 4(a)) of the predetermined first dividing line 21 to a position right below the condenser 522 of the laser beam application means 52. The chuck table 51 is then moved in the direction indicated by an arrow X1 in FIG. 4(a) at a predetermined processing feed rate while a pulse laser beam of a wavelength capable of passing through a silicon wafer is applied from the condenser 522. When the application position of the condenser 522 of the laser beam application means 52 reaches the other end (right end in FIG. 4(b)) of the first dividing line 21 as shown in FIG. 4(b), the application of the pulse laser beam is suspended and the movement of the chuck table 51 is stopped. In this first deteriorated layer forming step, the focal point P of the pulse laser beam is set to a position near the front surface 2a (undersurface) of the semiconductor wafer 2. As a result, a first deteriorated layer 210 is formed from the front surface 2a (undersurface) toward the inside continuously along the first dividing line 21. This first deteriorated layer 210 is formed as a molten and re-solidified layer.

The processing conditions in the above first deteriorated layer forming step are set as follows, for example.

Light source: LD excited Q switch Nd:YVO4 laser
Wavelength: pulse laser beam having a wavelength of 1,064 nm
Repetition frequency: 100 kHz
Pulse output: 40 ns
Average output: 1 W
Focal spot diameter: 1 μm
Processing feed rate: 100 mm/sec When the semiconductor wafer 2 is thick, as shown in FIG. 5, the above-described first deteriorated layer forming step is carried out several times by changing the focal point P stepwise so as to form a plurality of first deteriorated layers 210. For example, as the thickness of the first deteriorated layer formed once under the above processing conditions is about 50 μm, the above first deteriorated layer forming step is carried out three times to form first deteriorated layers 210 having a total thickness of 150 μm. In the case of a semiconductor wafer 2 having a thickness of 300 μm, six first deteriorated layers 210 may be formed from the front surface 2a to the rear surface 2b along the first dividing lines 21 in the inside of the semiconductor wafer 2. Further, the above first deteriorated layer 210 may be formed only in the inside of the semiconductor wafer 2 without being exposed to the front surface 2a and the rear surface 2b.

Figure 6:
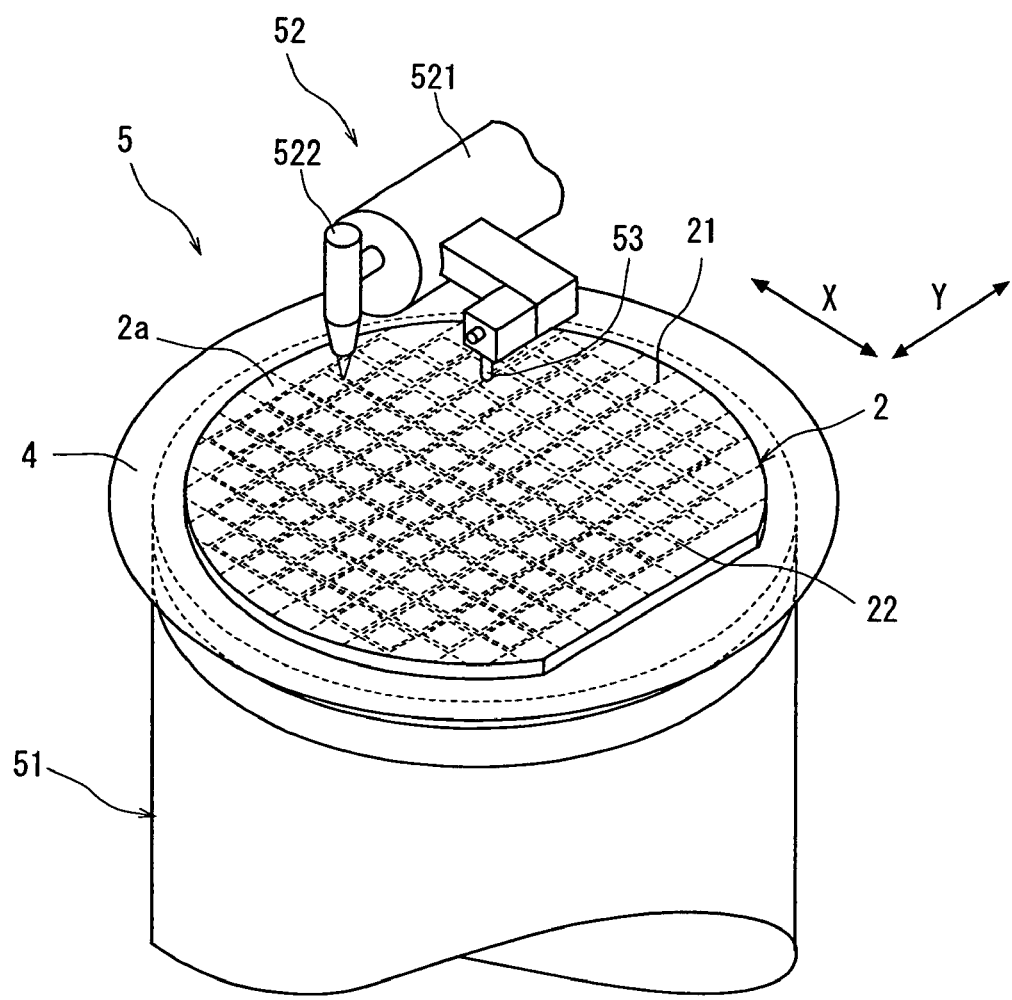
FIG. 6 is an explanatory diagram for the second deteriorated layer forming step in the wafer dividing method of the present invention.

After the above first deteriorated layer forming step is thus carried out along all the first dividing lines 21 extending in the predetermined direction of the semiconductor wafer 2, next comes the step of forming a second deteriorated layer in the inside of the semiconductor wafer 2 along the second dividing lines 21 except for the intersections with the first dividing lines 21 by applying a laser beam of a wavelength capable of passing through the semiconductor wafer 2 along the second dividing lines 22 except for the intersections with the first dividing lines 21. In the second deteriorated layer forming step, the chuck table 51 holding the semiconductor wafer 2 (wherein the first deteriorated layer 210 is formed along the first dividing lines 21) is positioned to a location that it is turned at 90° as shown in FIG. 6.

Figure 7:
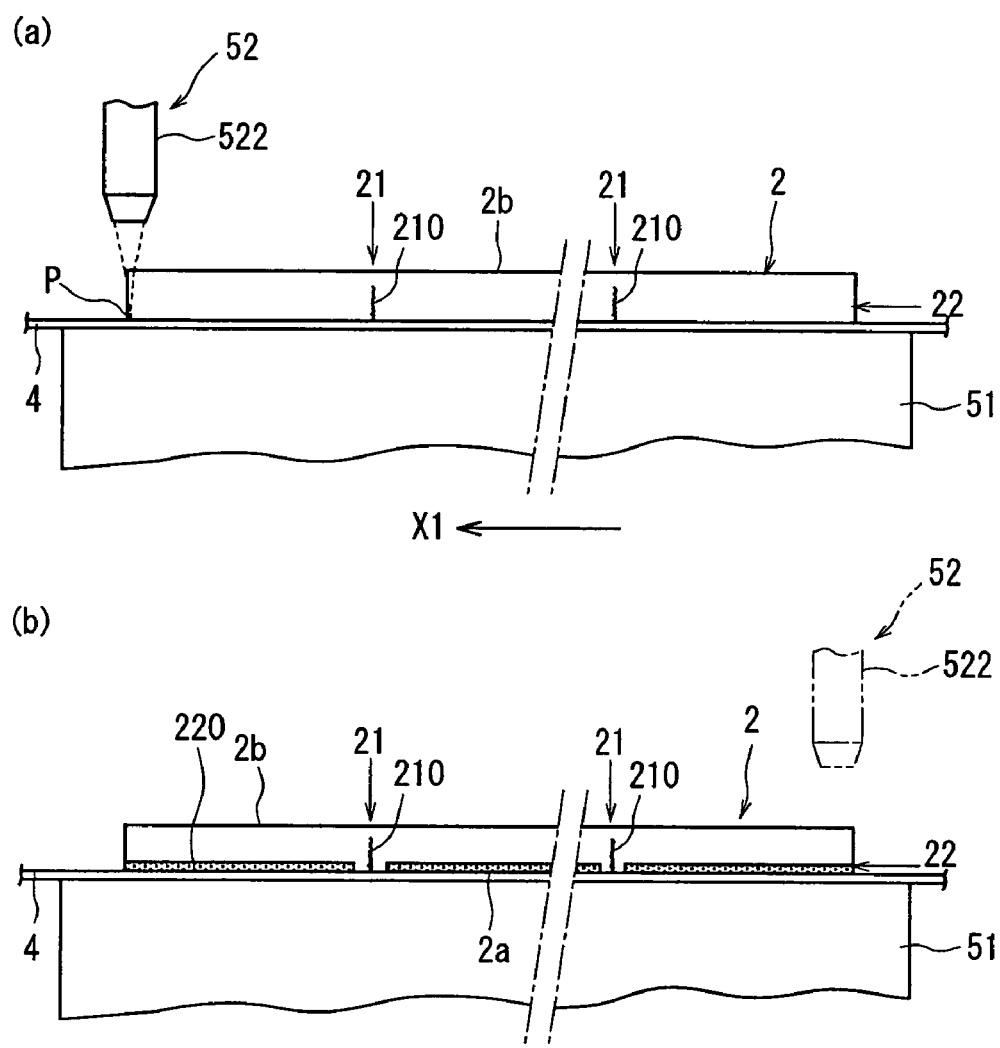
FIGS. 7(a) and 7(b) are explanatory diagrams for the second deteriorated layer forming step in the wafer dividing method of the present invention.

After the chuck table 51 holding the semiconductor wafer 2 is turned at 90°, the chuck table 51 is moved to the laser beam application area where the condenser 522 of the laser beam application means 52 is located as shown in FIG. 7(a) to bring one end (left end in FIG. 7(a)) of a predetermined second dividing line 22 to a position right below the condenser 522 of the laser beam application means 52. The chuck table 51 is then moved in the direction indicated by the arrow X1 in FIG. 7(a) at a predetermined processing-feed rate while a pulse laser beam of a wavelength capable of passing through a silicon wafer is applied from the condenser 522. When a position 5 to 250 μm away from the intersection with the first dividing line 21 on the anterior side (left side in FIG. 7) in the moving direction reaches a position right below the condenser 522, the application of the pulse laser beam is suspended. Further, when a position 5 to 250 μm away from the intersection with the first dividing line 21 on the posterior side (right side in FIG. 7) in the moving direction reaches a position right below the condenser 522, the application of the pulse laser beam is resumed. A second deteriorated layer 220 is formed in the inside of the semiconductor wafer 2 along the second dividing line 22 except for the intersections with the first dividing lines 21 as shown in FIG. 7(b) by applying a laser beam of a wavelength capable of passing through the semiconductor wafer 2 along the second dividing line 22 except for the intersections with the first dividing lines 21. The area where the second deteriorated layer 220 is not formed, of the above intersection is 10 to 500 μm in the above embodiment. The application and suspension of the pulse laser beam are carried out by controlling the laser beam application means 52 by means of the control means (not shown) provided in the laser beam processing machine 5 based on the coordinate values, which are stored in the memory, of the intersections between the first dividing lines 21 and the second dividing lines 22 and a detection signal from the processing-feed amount detection means that is not shown. The second deteriorated layers 220 and the first deteriorated layers 210 formed as described above are not formed at the intersections between the first dividing lines 21 and the second dividing lines 22. In this second deteriorated layer forming step, the focal point P of the pulse laser beam is also set to a position near the front surface 2a (undersurface) of the semiconductor wafer 2. As a result, the second deteriorated layer 220 is formed from the front surface 2a (undersurface) toward the inside along the second dividing lines 22. The processing conditions of the second deteriorated layer forming step may be the same as those of the above first deteriorated layer forming step.

After the first deteriorated layer forming step and the second deteriorated layer forming step, next comes the step of dividing the semiconductor wafer 2 along the first dividing lines 21 where the first deteriorated layer 210 has been formed by exerting external force to the semiconductor wafer 2 along the first dividing lines 21. This first dividing step is carried out by using a dividing apparatus 6 shown in FIG. 8.

Figure 8:
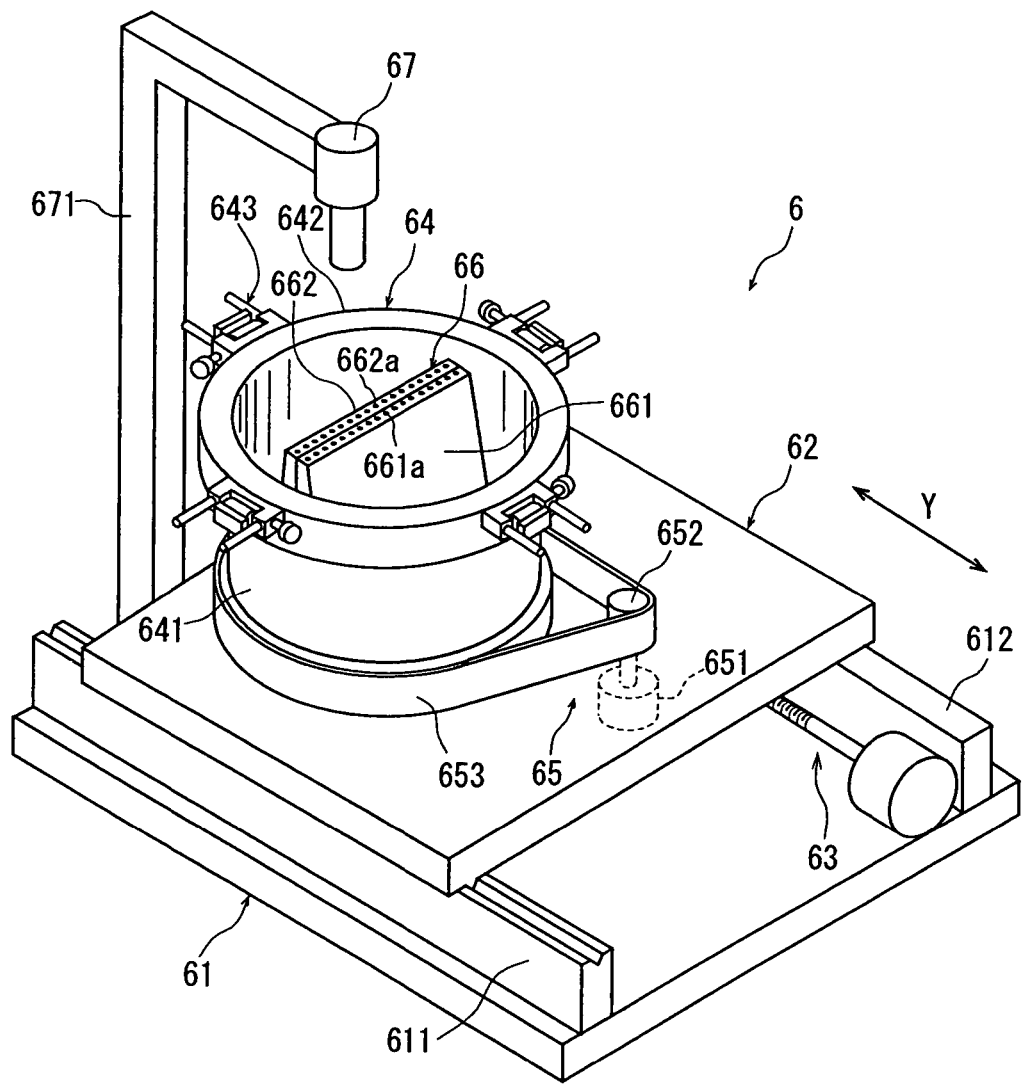
FIG. 8 is a perspective view of a dividing apparatus for carrying out the first dividing step and the second dividing step in the wafer dividing method of the present invention.

The dividing apparatus 6 shown in FIG. 8 comprises a base 61 and a movable table 62 which is mounted on the base 61 in such a manner that it can move in the direction indicated by the arrow Y. The base 61 is rectangular and is provided with two guide rails 611 and 612 which are arranged on top of the both side portions of the base 61 and parallel to each other in the direction indicated by the arrow Y. The above movable table 62 is movably mounted on the two guide rails 611 and 612. This movable table 62 is moved in the direction indicated by the arrow Y by a moving means 63. A frame holding means 64 for holding the above annular frame 3 is mounted on the movable table 62. The frame holding means 64 is composed of a cylindrical body 641, an annular frame holding member 642 mounted on the upper end of the body 641, and a plurality of clamps 643 as fixing means arranged at the outer periphery of the frame holding member 642. The frame holding means 64 constituted as described above fixes the annular frame 3 placed on the frame holding member 642 by the clamps 643. Further, the dividing apparatus 6 shown in FIG. 8 has a turning means 65 for turning the above frame holding means 64. This turning means 65 is composed of a pulse motor 651 arranged on the above movable table 62, a pulley 652 mounted on the rotary shaft of the pulse motor 651, and an endless belt 653 wound round the pulley 652 and the cylindrical body 641. The turning means 65 constituted as described above turns the frame holding means 64 through the pulley 652 and the endless belt 653 by driving the pulse motor 651.

The dividing apparatus 6 shown in FIG. 8 has a tensile force exerting means 66 for exerting tensile force in a direction perpendicular to the dividing lines to the semiconductor wafer 2 supported to the annular frame 3 held on the above annular frame holding member 642 through the protective tape 4. The tensile force exerting means 66 is installed within the body 641 of the frame holding means 64. This tensile force exerting means 66 has a first suction-holding member 661 and a second suction-holding member 662 both having a rectangular holding surface prolonged in the direction perpendicular to the direction indicated by the arrow Y. A plurality of suction holes 661a are formed in the first suction-holding member 661 and a plurality of suction holes 662a are formed in the second suction-holding member 662. The plurality of suction holes 661a and the plurality of suction holes 662a are communicated to a suction means that is not shown. The respective first suction-holding member 661 and second suction-holding member 662 are designed to be moved in the direction indicated by the arrow Y by a moving means that is not shown.

The dividing apparatus 6 shown in FIG. 8 comprises a detection means 67 for detecting the dividing lines of the semiconductor wafer 2 supported to the annular frame 3 held on the above annular frame holding member 642 through the protective tape 4. The detection means 67 is attached to an L-shaped support pillar 671 installed on the base 61. This detection means 67 is constituted by an optical system and an image pick-up device (CCD), and is positioned above the above tensile force exerting means 66. The detection means 67 constituted as described above picks up an image of a dividing line of the semiconductor wafer 2 supported to the annular frame 3 held on the above annular frame holding member 642 through the protective tape 4, converts it into an electric signal and supplies it to the control means that is not shown.

The first dividing step which is carried out by using the above-described dividing apparatus 6 will be described with reference to FIG. 8 and FIGS. 9(a) and 9(b).

Figure 9:
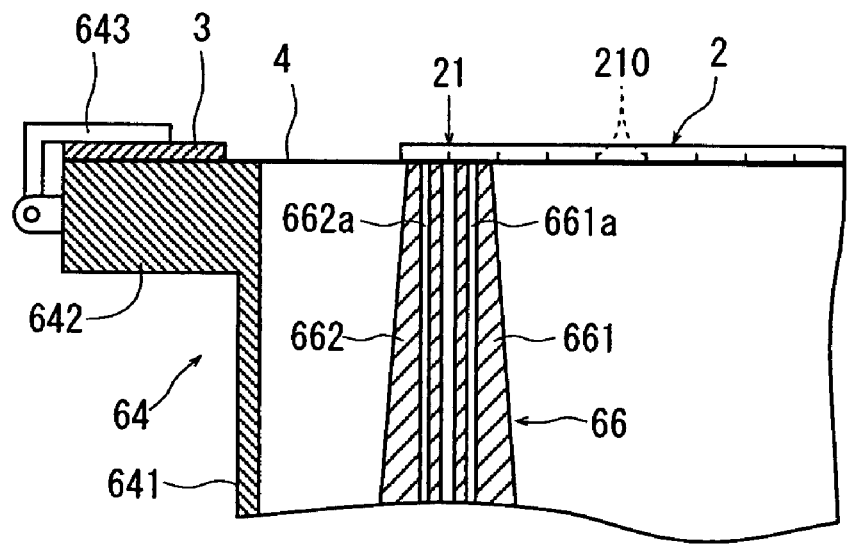
FIGS. 9(a) and 9(b) are explanatory diagrams for the first dividing step in the wafer dividing method of the present invention.
Figure 9:
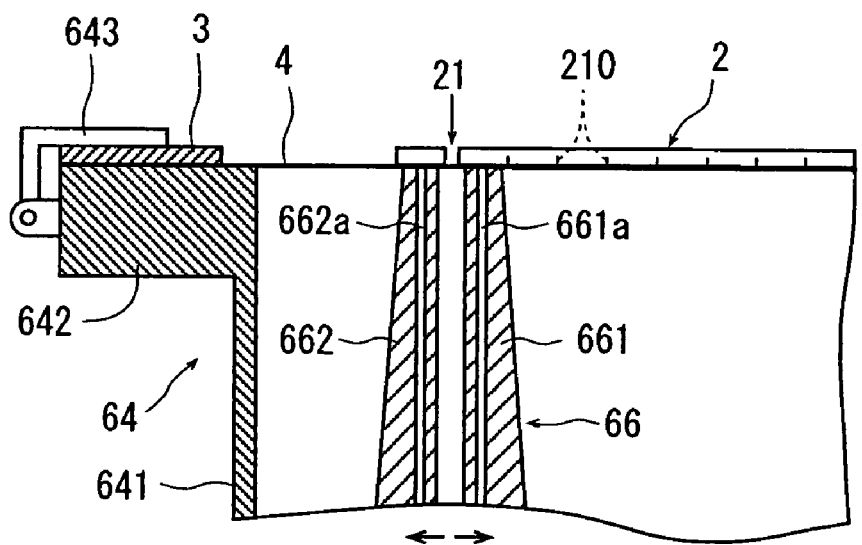

The annular frame 3 supporting the semiconductor wafer 2 which has been subjected to the above first deteriorated layer forming step and the above second deteriorated layer forming step through the protective tape 4 is placed on the frame holding member 642 as shown in FIG. 9(a) and fixed on the frame holding member 642 by the clamps 643. Thereafter, the moving means 63 is activated to move the movable table 62 in the direction indicated by the arrow Y (see FIG. 8) so as to bring one first dividing line 21 (the most left dividing line in the illustrated embodiment) where the first deteriorated layer 210 has been formed, of the semiconductor wafer 2 to a position between the holding surface of the first suction-holding member 661 and the holding surface of the second suction-holding member 662 constituting the tensile force exerting means 66, as shown in FIG. 9(a). At this point, an image of the first dividing line 21 is picked up by the detection means 67 to carry out alignment of the holding surface of the first suction-holding member 661 with the holding surface of the second suction-holding member 662. After the first dividing line 21 is thus positioned between the holding surface of the first suction-holding member 661 and the holding surface of the second suction-holding member 662, the suction means (not shown) is activated to exert negative pressure to the suction holes 661a and 662a so as to suction-hold the semiconductor wafer 2 on the holding surface of the first suction-holding member 661 and the holding surface of the second suction-holding member 662 through the protective tape 4 (holding step).

After the above holding step, the moving means (not shown) constituting the tensile force exerting means 66 is activated to move the first suction-holding member 661 and the second suction-holding member 662 in directions separating from each other, as shown in FIG. 9(b). As a result, tensile force is exerted to the first dividing line 21 positioned between the holding surface of the first suction-holding member 661 and the holding surface of the second suction-holding member 662 in a direction perpendicular to the first dividing line 21, thereby dividing the semiconductor wafer 2 along the first dividing line 21 (first dividing step). By carrying out this first dividing step, the protective tape 4 is slightly stretched. In this dividing step, as the strength of the semiconductor wafer 2 has been reduced by the formation of the first deteriorated layer 210 along the first dividing line 21, the semiconductor wafer 2 can be divided along the first dividing line 21 by moving the first suction-holding member 661 and the second suction-holding member 662 by about 0.5 mm in the directions separating from each other. In this first dividing step, the second deteriorated layers 220 are formed along the second dividing lines 22 perpendicular to the first dividing lines 21 where the first deteriorated layer 210 has been formed except for the intersections with the first dividing lines 21, and the second deteriorated layers 220 and the first deteriorated layers 210 are not formed at the intersections between the first dividing lines 21 and the second dividing lines 22. Therefore, when the semiconductor wafer 2 is divided along the first dividing lines 21 where the first deteriorated layer 210 has been formed, this division does not reach the second dividing lines 22 through the intersections. Consequently, the semiconductor wafer 2 is divided along the first dividing lines 21 linearly and accurately.

After the first dividing step for dividing the semiconductor wafer 2 along one first dividing line 21 formed in the predetermined direction as described above, the suction-holding of the semiconductor wafer 2 by the first suction-holding member 661 and the second suction-holding member 662 is cancelled. Thereafter, the moving means 63 is activated to move the movable table 62 a distance corresponding to the interval between the first dividing lines 21 in the direction (see FIG. 8) indicated by the arrow Y so as to bring a first dividing line 21 next to the first dividing line 21 which has been subjected to the above first dividing step to a position between the holding surface of the first suction-holding member 661 and the holding surface of the second suction-holding member 662 constituting the tensile force exerting means 66. Thereafter, the above holding step and the above first dividing step are carried out. By carrying out the above holding step and the first dividing step on all the first dividing lines 21 formed in the predetermined direction as described above, the semiconductor wafer 2 is divided into strip-shaped pieces along the first dividing line 21.

Figure 10:
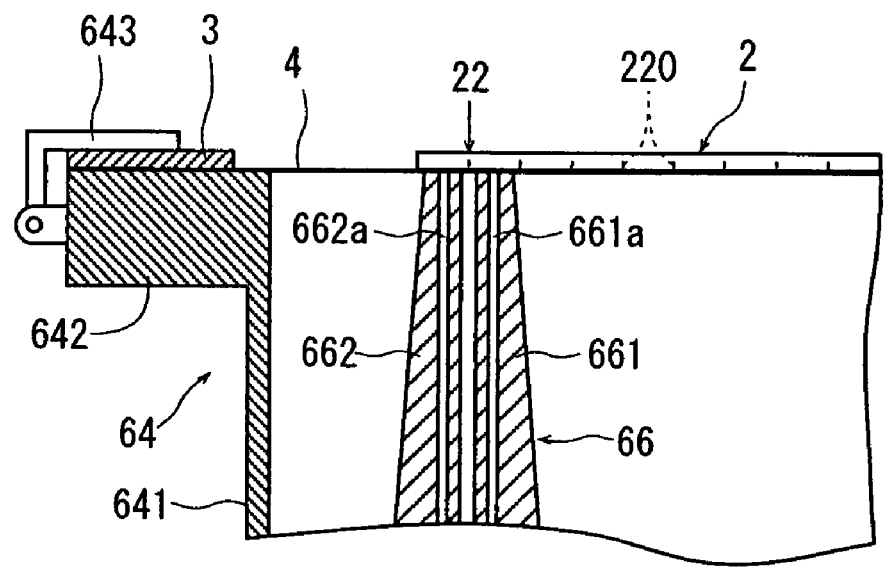
FIGS. 10(a) and 10(b) are explanatory diagrams for the second dividing step in the wafer dividing method of the present invention.
Figure 10:
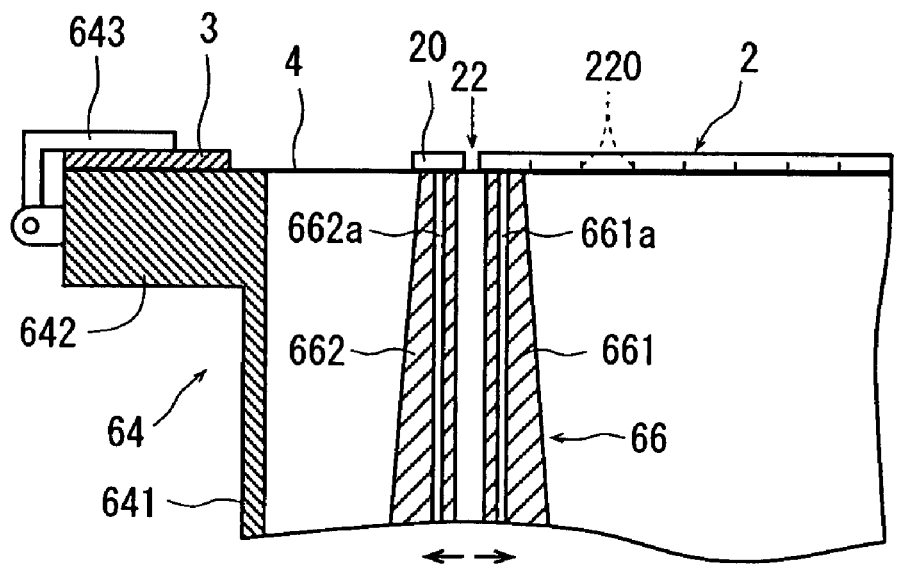

After the above first dividing step, the frame holding means 64 holding the annular frame 3 supporting the semiconductor wafer 2 through the protective tape 4 is brought to a position where it has been turned at 90°. Next comes a second dividing step for exerting external force to the semiconductor wafer 2 formed into strip-shaped pieces, along the second dividing lines 22 to divide it along the second dividing lines 22 where the second deteriorated layer 220 has been formed. That is, the moving means 63 is activated to move the movable table 62 in the direction (see FIG. 8) indicated by the arrow Y so as to bring one second dividing line 22 (the most left dividing line in the illustrated embodiment) where the second deteriorated layer 220 has been formed, of the semiconductor wafer 2 to a position between the holding surface of the first suction-holding member 661 and the holding surface of the second suction-holding member 662 constituting the tensile force exerting means 66, as shown in FIG. 10(a). At this point, an image of the second dividing line 22 is picked up by the detection means 67 to carry out alignment of the holding surface of the first suction-holding member 661 with the holding surface of the second suction-holding member 662. After the second dividing line 22 is positioned between the holding surface of the first suction-holding member 661 and the holding surface of the second suction-holding member 662 as described above, the suction means (not shown) is activated to exert negative pressure to the suction holes 661a and 662a so as to suction-hold the semiconductor wafer 2 divided into strip-shaped pieces on the holding surface of the first suction-holding member 661 and the holding surface of the second suction-holding member 662 through the protective tape 4 (holding step).

After the above holding step, the moving means (not shown) constituting the tensile force exerting means 66 is activated to move the first suction-holding member 661 and the second suction-holding member 662 in directions separating from each other, as shown in FIG. 10(b). As a result, tensile force is exerted to the second dividing line 22 positioned between the holding surface of the first suction-holding member 661 and the holding surface of the second suction-holding member 662 in a direction perpendicular to the second dividing line 22, thereby dividing the semiconductor wafer 2 divided into strip-shaped pieces along the second dividing line 22 (second dividing step). By carrying out this second dividing step, the protective tape 4 is slightly stretched. In this second dividing step, as the strength of the semiconductor wafer 2 has been reduced by the formation of the second deteriorated layer 220 along the second dividing line 22, the semiconductor wafer 2 divided into strip-shaped pieces can be divided along the second dividing line 22 by moving the first suction-holding member 661 and the second suction-holding member 662 by about 0.5 mm in the directions separating from each other.

After the second dividing step for dividing the semiconductor wafer 2 along one second dividing line 22 as described above, the suction-holding of the semiconductor wafer 2 by the first suction-holding member 661 and the second suction-holding member 662 is cancelled. Thereafter, the moving means 63 is activated to move the movable table 62 a distance corresponding to the interval between the second dividing lines 22 in the direction (see FIG. 8) indicated by the arrow Y so as to bring a second dividing line 22 next to the second dividing line 22 which has been subjected to the above second dividing step to a position between the holding surface of the first suction-holding member 661 and the holding surface of the second suction-holding member 662 constituting the tensile force exerting means 66. Thereafter, the above holding step and the second dividing step are carried out. By carrying out the above holding step and the second dividing step on all the second dividing lines 22 formed in the predetermined direction as described above, the semiconductor wafer 2 divided into strip-shaped pieces is divided into individual chips 20 along the second dividing lines 22.

Since the semiconductor wafer 2 has been divided into strip-shaped pieces along the first dividing lines 21 when the above second dividing step is carried out, tensile force acts on a direction perpendicular to the second dividing lines 22, whereby the semiconductor wafer 2 is divided along the second dividing lines 22 accurately.

A description will be subsequently given of a second embodiment of the wafer dividing method of the present invention.

Figure 11:
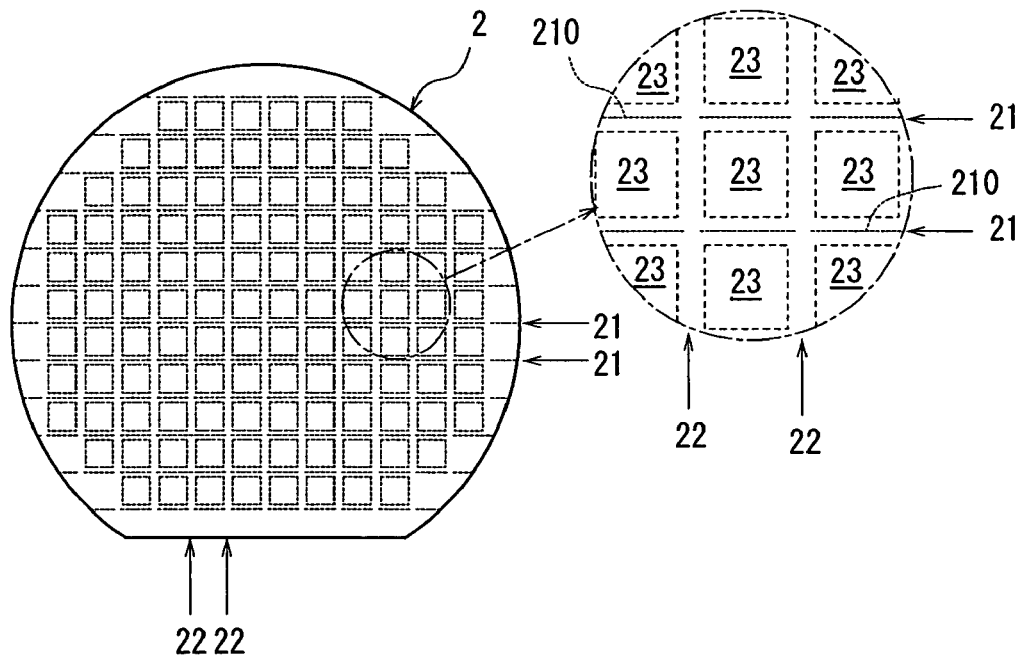
FIG. 11 is a plan view of the semiconductor wafer which has been subjected to the first deteriorated layer forming step in the second embodiment of the wafer dividing method of the present invention.
Figure 12:
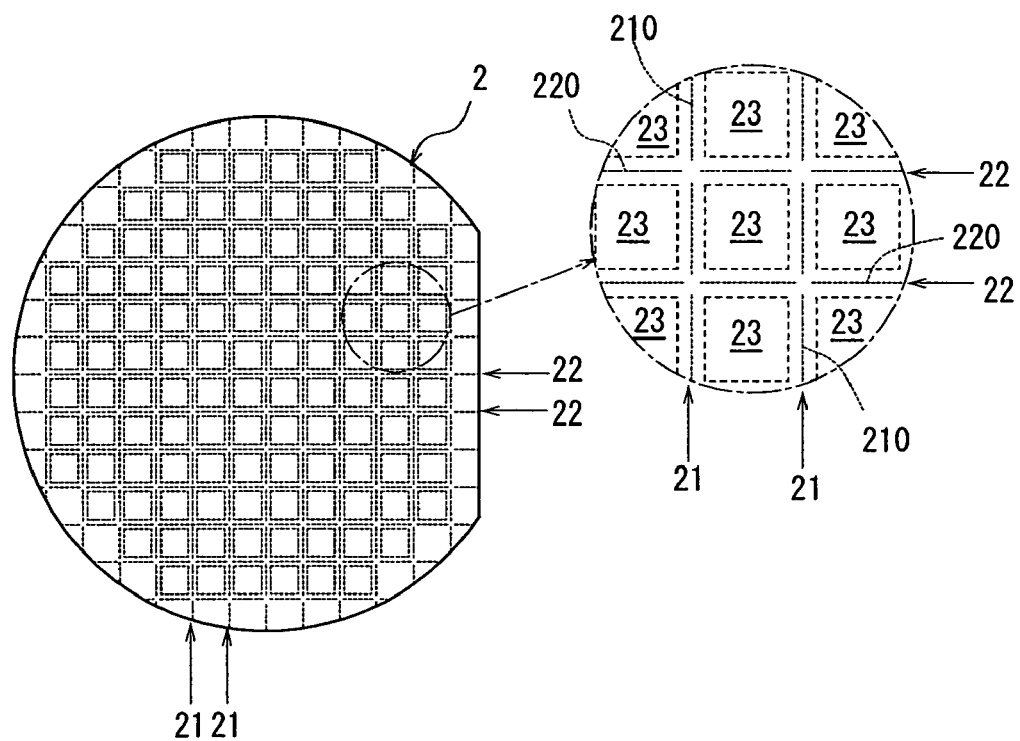
FIG. 12 is a plan view of the semiconductor wafer which has been subjected to the second deteriorated layer forming step in the second embodiment of the wafer dividing method of the present invention.

The second embodiment differs from the above-mentioned first embodiment in the first deteriorated layer forming step for forming the first deteriorated layer in the inside of the semiconductor wafer 2 along the first dividing lines 21 by applying a laser beam of a wavelength capable of passing through a wafer along the first dividing lines 21. That is, the first deteriorated layer forming step in the second embodiment is to form the first deteriorated layer 210 in the inside of the semiconductor wafer 2 along the first dividing lines 21 except for the intersections with the second dividing lines 22 by applying a laser beam of a wavelength capable of passing through a wafer along the first dividing lines 21 except for the intersections with the second dividing lines 22, as shown in FIG. 11. This first deteriorated layer forming step in the second embodiment can be carried out by the same laser processing technique as in the second deteriorated layer forming step of the above first embodiment. After the first deteriorated layer 210 is formed in the inside of the semiconductor wafer 2 along the first dividing lines 21 except for the intersections with the second dividing lines 22 as described above, the second deteriorated layer forming step of the first embodiment is carried out to form the second deteriorated layer 220 in the inside of the semiconductor wafer 2 along the second dividing lines 22 except for the intersections with the first dividing lines 21, as shown in FIG. 12. Therefore, the first deteriorated layers 210 and the second deteriorated layers 220 are not formed at the intersections between the first dividing lines 21 and the second dividing lines 22.

The first deteriorated layer forming step and the second deteriorated layer forming step are followed by the first dividing step and the second dividing step of the first embodiment. In the second embodiment, the first dividing step may be carried out on the first dividing lines 21 or the second dividing lines 22. That is, in the first dividing step, external force is exerted to the semiconductor wafer 2 along the first dividing lines 21 or the second dividing lines 22 to divide the semiconductor wafer 2 along the first dividing lines 21 where the first deteriorated layer 210 has been formed or the second dividing lines 22 where the second deteriorated layer 220 has been formed. In the second dividing step, external force is exerted to the semiconductor wafer 2 along the second dividing lines 22 or the first dividing lines 21 after the first dividing step has been carried out, to divide the semiconductor wafer 2 along the second dividing lines 22 where the second deteriorated layer 220 has been formed or the first dividing lines 21 where the first deteriorated layer 210 has been formed. The first dividing step and the second dividing step can be carried out in the same manner as the first dividing step and the second dividing step of the first embodiment.

Since the first deteriorated layers 210 and the second deteriorated layers 220 are not formed at the intersections between the first dividing lines 21 and the second dividing lines 22 in the above second embodiment as well, when the semiconductor wafer 2 is divided along the first dividing lines 21 where the first deteriorated layer 210 has been formed or the second dividing lines 22 where the second deteriorated layer 220 has been formed, this division does not reach the second dividing lines 22 or the first dividing lines 21 through the intersections. Therefore, the semiconductor wafer 2 is divided along the first dividing lines 21 or the second dividing lines 22 linearly and accurately.

While the present invention has been described based on the illustrated embodiments, it is to be understood that the present invention is not limited thereto and various changes and modifications may be made without departing from the spirit and scope of the invention. For example, in the above embodiments, the semiconductor wafer having devices such as IC's or LSI's formed thereon is divided into individual devices (chips). The wafer dividing method of the present invention can be applied to the division of a wafer having no device like quartz glass.

In the above embodiments, the front surface of the semiconductor wafer is put on the protective tape mounted on the annular frame and then, the deteriorated layer forming step for forming the deteriorated layer along the dividing lines is carried out in a state where the semiconductor wafer is supported to the annular frame. After the deteriorated layer forming step for forming the deteriorated layer along the dividing lines of the wafer, the rear surface of the wafer may be put on the protective tape mounted on the annular frame and the dividing step may be carried out in a state where the front surface of the wafer faces up.

What is claimed is:

1. A method of dividing a wafer which is partitioned by a plurality of first dividing lines extending in a predetermined direction and a plurality of second dividing lines formed in a predetermined direction perpendicular to the plurality of first dividing lines, forming intersections of the first dividing lines and the second dividing lines, comprising the steps of:

storing coordinate values of intersections between the first dividing lines and the second dividing lines;

forming a first continuous deteriorated layer in the inside of the wafer along the first dividing lines by applying a laser beam of a wavelength capable of passing through the wafer along the first dividing lines;

forming a second deteriorated layer inside of the wafer along the second dividing lines continuously between neighboring intersections by continuously applying a laser beam of a wavelength capable of passing through the wafer except at the intersections based on the stored coordinate values of the intersections;

dividing the wafer along the first dividing lines where the first deteriorated layer has been formed by exerting external force to the wafer along the first dividing lines after the first deteriorated layer forming step and the second deteriorated layer forming step; and dividing the wafer along the second dividing lines where the second deteriorated layer has been formed by exerting external force to the wafer along the second dividing lines after the first dividing step.

2. A method of dividing a wafer which is partitioned by a plurality of first dividing lines extending in a predetermined direction and a plurality of second dividing lines formed in a predetermined direction perpendicular to the plurality of first dividing lines, forming intersections of the first dividing lines and the second dividing lines, comprising the steps of:

storing coordinate values of intersections between the first dividing lines and the second dividing lines;

forming a first deteriorated layer inside of the wafer along the first dividing lines continuously between neighboring intersections by continuously applying a laser beam of a wavelength capable of passing through the wafer except at the intersections based on the stored coordinate values of the intersections;

forming a second deteriorated layer inside of the wafer along the second dividing lines continuously between neighboring intersections by continuously applying a laser beam of a wavelength capable of passing through the wafer except at the intersections based on the stored coordinate values of the intersections;

dividing the wafer along the first dividing lines where the first deteriorated layer has been formed or the second dividing lines where the second deteriorated layer has been formed by exerting external force to the wafer along the first dividing lines or the second dividing lines after the first deteriorated layer forming step and the second deteriorated layer forming step; and dividing the wafer along the second dividing lines where the second deteriorated layer has been formed or the first dividing lines where the first deteriorated layer has been formed by exerting external force to the wafer along the second dividing lines or the first dividing lines after the first dividing step.

3. The wafer dividing method according to claim 1 or 2, wherein the first deteriorated layer forming step, the second deteriorated layer forming step, the first dividing step and the second dividing step come after the step of affixing the wafer to a protective tape mounted on an annular frame.

4. The wafer dividing method according to claim 1, wherein the wafer is a silicon semiconductor wafer, and each end of the second deteriorated layer formed along the predetermined direction of the second dividing line is positioned 5 to 250 μm away from the intersection of the first and the second dividing lines.

5. The wafer dividing method according to claim 4, wherein each end of the first deteriorated layer formed along the predetermined direction of the first dividing line is positioned 5 to 250 μm away from the intersection of the first and the second dividing lines.

6. The wafer dividing method according to claim 1, wherein the first continuous deteriorated layer and the second deteriorated layer each are formed inside of the wafer at a distance from a front surface of the wafer and from a rear surface of the wafer.

7. The wafer dividing method according to claim 2, wherein the first and the second deteriorated layers each are formed inside of the wafer at a distance from a front surface of the wafer and from a rear surface of the wafer.

* * * * *